United States Patent
Molas et al.

(10) Patent No.: US 9,431,607 B2
(45) Date of Patent: Aug. 30, 2016

(54) METAL-OXIDE-BASED CONDUCTIVE-BRIDGING RANDOM ACCESS MEMORY (CBRAM) HAVING THE SOLID ELECTROLYTE DOPED WITH A SECOND METAL

(71) Applicant: COMMISSARIAT A L'ENERGIE ATOMIQUE ET AUX ENERGIES ALTERNATIVES, Paris (FR)

(72) Inventors: Gabriel Molas, Grenoble (FR); Philippe Blaise, Grenoble (FR); Faiz Dahmani, La Varenne Saint-Hilaire (FR); Rémy Gassiloud, Saint-Laurent-du-Pont (FR); Elisa Vianello, Grenoble (FR)

(73) Assignee: COMMISSARIAT À L'ÉNERGIE ATOMIQUE ET AUX ÉNERGIES ALTERNATIVES, Paris (FR)

( * ) Notice: Subject to any disclaimer, the term of this patent is extended or adjusted under 35 U.S.C. 154(b) by 0 days.

(21) Appl. No.: 14/669,279

(22) Filed: Mar. 26, 2015

(65) Prior Publication Data
US 2015/0280120 A1    Oct. 1, 2015

(30) Foreign Application Priority Data
Mar. 26, 2014  (FR) .................... 14 52573

(51) Int. Cl.
| | |
|---|---|
| *H01L 29/04* | (2006.01) |
| *H01L 47/00* | (2006.01) |
| *H01L 45/00* | (2006.01) |
| *G11C 13/00* | (2006.01) |

(52) U.S. Cl.
CPC ......... *H01L 45/146* (2013.01); *G11C 13/0011* (2013.01); *H01L 45/085* (2013.01); *H01L 45/1233* (2013.01); *H01L 45/1266* (2013.01); *G11C 2213/32* (2013.01)

(58) Field of Classification Search
CPC ............... H01L 45/143; H01L 45/085; H01L 45/1233; H01L 45/146; H01L 45/1266; G11C 13/0011
See application file for complete search history.

(56) References Cited

U.S. PATENT DOCUMENTS

| | | |
|---|---|---|
| 2010/0078758 A1 | 4/2010 | Sekar et al. |
| 2012/0292587 A1 | 11/2012 | Matsuo et al. |
| 2013/0082228 A1 | 4/2013 | Parrillo et al. |

FOREIGN PATENT DOCUMENTS

| | | |
|---|---|---|
| EP | 2 141 753 A2 | 1/2010 |
| WO | WO 2010/118380 A2 | 10/2010 |

OTHER PUBLICATIONS

Huang et al., "Superior resistive switching characteristics of Cu—TiO2 based RRAM cell," Nanoelectronics Conference (INEC), 2013 IEEE 5TH International, Jan. 2013, pp. 236-239.

*Primary Examiner* — Stephen W Smoot
*Assistant Examiner* — Vicki B Booker
(74) *Attorney, Agent, or Firm* — Pillsbury Winthrop Shaw Pittman LLP

(57) ABSTRACT

A resistive random access memory device includes a first electrode made of inert material; a second electrode made of soluble material, and a solid electrolyte, the first and second electrodes being respectively in contact with one of the faces of the electrolyte, the second electrode to supply mobile ions circulating in the solid electrolyte to the first electrode to form a conductive filament between the first and second electrodes when a voltage is applied between the first and second electrodes, the solid electrolyte including a region made of a first metal oxide that is doped by a second metal, distinct from the first metal and able to form a second metal oxide, the second metal selected such that the first metal oxide doped by the second metal has a band gap energy less than or equal to that of the first metal oxide not doped by the second metal.

11 Claims, 3 Drawing Sheets

Prior Art

METAL-OXIDE-BASED CONDUCTIVE-BRIDGING RANDOM ACCESS MEMORY (CBRAM) HAVING THE SOLID ELECTROLYTE DOPED WITH A SECOND METAL

CROSS REFERENCE TO RELATED APPLICATION

This application claims the benefit of priority from French Patent Application No. 1452573 filed on Mar. 26, 2014, the entire content of which is incorporated herein by reference.

FIELD

The present invention relates to the field of rewritable non-volatile memories, and more specifically that of resistive random access memories. A resistive random access memory comprises first and second electrodes separated by a layer made of electrically insulating material, and passes from an insulating state to a conducting state by formation of a conductive filament between the first and second electrodes.

BACKGROUND

Resistive Random Access Memories (RRAM) are today the subject of great interest, particularly on account of their low electrical consumption and their high operating speed.

A resistive type memory cell has at least two states: a "High Resistance State" (HRS), also called "OFF" state, and a "Low Resistance State" (LRS) or "ON" state. It may thus be used to store binary information.

Three types of resistive memories may be distinguished: memories based on thermochemical mechanism, memories based on valence change, and memories based on electrochemical metallisation.

The field of the present invention more particularly relates to this latter category based on ion conduction materials (CBRAM or "Conductive Bridging RAM" memories). The operation resides in the formation and the reversible rupture of a conductive filament in a solid electrolyte, through dissolution of a soluble electrode. These memories are promising due to their low programming voltages (of the order of a Volt), their short programming times (<1 µs), their low consumption and their low integration cost. Furthermore, these memories can be integrated into the metallisation levels of the logic of a circuit ("above IC"), which makes it possible to increase the integration density of the circuit. From the architectural viewpoint, they only require a selection device, a transistor or a diode for example.

The operation of CBRAM memories is based on the formation, within a solid electrolyte, of one or more metal filaments (also called "dendrites") between two electrodes, when the electrodes are taken to suitable potentials. The formation of the filament makes it possible to obtain a given electrical conduction between the two electrodes. By modifying the potentials applied to the electrodes, it is possible to modify the distribution of the filament, and thus to modify the electrical conduction between the two electrodes. For example, by reversing the potential between the electrodes, it is possible to make disappear or reduce the metal filament, so as to eliminate or reduce considerably the electrical conduction due to the presence of the filament.

FIG. 1 schematically illustrates the passage from an "OFF" state to an "ON" state for a CBRAM type memory device 1.

The device 1 is formed by a Metal/Conductive ion/Metal type stack. It comprises a solid electrolyte 2, for example based on doped chalcogenide (e.g. GeS) or oxide (e.g. $Al_2O_3$). The electrolyte 2 is arranged between a lower electrode 3, for example made of Pt, forming an inert cathode, and an upper electrode 4 comprising a portion of ionisable metal, for example copper, and forming an anode. A portion of ionisable metal is a portion of metal able to form metal ions (here $Cu^{2+}$ ions) when it is subjected to a suitable electrical potential. The device 1 represented in FIG. 1 typically forms a memory point, that is to say a unit memory cell, of a memory comprising a multitude of these memory devices.

As indicated previously, the memory state of a CBRAM memory device results from the difference in electrical resistivity between two states: "ON" and "OFF".

In the "OFF" state, the metal ions (here $Cu^{2+}$ ions for a soluble electrode comprising Cu) coming from the portion of ionisable metal are dispersed throughout the solid electrolyte 2. Thus, no electrical contact is established between the cathode 3 and the anode 4, that is to say between the upper electrode and the lower electrode. The solid electrolyte comprises an electrically insulating zone of high resistivity between the anode and the cathode.

When a positive potential V is applied to the upper soluble electrode 4 (the anode), an oxidation-reduction reaction takes place at the electrode, creating mobile ions 5. In the case of a copper electrode 4, the following reaction takes place:

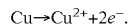

$$Cu \rightarrow Cu^{2+} + 2e^-.$$

The ions 5 then move in the electrolyte 2 under the effect of the electrical field applied to the electrodes. The speed of movement depends on the mobility of the ion in the electrolyte in question, which guides the choice of the soluble electrode/electrolyte pairing (examples: Ag/GeS; $Cu/Al_2O_3$ . . . ). The speeds of movement of the ions are of the order of nm/ns.

On arrival at the inert electrode 3 (the cathode), the ions 5 are reduced due to the presence of electrons supplied by the electrode 3, leading to the growth of a metal filament 6 according to the following reaction:

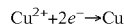

$$Cu^{2+} + 2e^- \rightarrow Cu$$

The filament 6 grows preferentially in the direction of the soluble electrode 4.

The memory 1 then passes to the "ON" state when the filament 6 enables contact between the electrodes 3 and 4, making the stack conductive. This phase is called "SET" of the memory.

To pass to the "OFF" state ("RESET" phase of the memory), a negative voltage V is applied to the upper electrode 4, leading to the dissolution of the conductive filament. To justify this dissolution, thermal (heating) and oxidation-reduction mechanisms are generally put forward. More precisely, the step consisting in writing for the first time the memory 1, that is to say forming for the first time the filament 6 in the electrolyte 2 of the memory 1, is called "forming". "SET" is thus taken to mean the step of formation of the filament 6 carried out after at least one first erasing of the memory cell, that is to say after the filament of the memory cell has at least been formed a first time (forming step) then dissolved (RESET step).

Often, the electrolyte 2 contains in the "OFF" state a residual filament 6 in contact with the cathode 3. This stems from the preceding SET phase and has not been dissolved during the RESET of the memory. The filament is designated residual when it does not establish a sufficient electrical conduction between electrodes to obtain the "ON" state.

An area of development for CBRAM memories relates to the retention of information, that is to say the retention of the "OFF" state and the "ON" state. It is sought to improve the stability of the insulating and conducting states, particularly for high operating temperatures. To improve the retention of information, metal oxide based CBRAM memories have been proposed.

Numerous studies relate to these CBRAM memories to improve their electrical performances. One of the difficulties of metal oxide based CBRAM memories in fact concerns the difficulty of forming the filament in the electrolyte during the first use of the memory, that is to say during the forming step. It thus involves managing to reduce the voltage, designated "forming voltage", required for the formation of the filament in the electrolyte during the first use of the CBRAM memory cell.

SUMMARY

An aspect of the invention aims to supply a solution to the problems evoked previously by proposing a metal oxide based CBRAM memory cell with improved electrical performances, and in particular with a reduced forming voltage, by facilitating the formation of the conductive filament. Reducing the forming voltage of a CBRAM memory cell makes it possible in particular, at constant voltage, to work with shorter switch times and thus to obtain a faster CBRAM memory cell. "Switch time" of the CBRAM memory cell is taken to mean the time required for the CBRAM memory cell to pass from the "OFF" state to the "ON" state.

A first aspect of the invention thus relates to a resistive random access memory device comprising:
  a first electrode made of inert material;
  a second electrode made of soluble material;
  a solid electrolyte, the first and second electrodes being respectively in contact with one of the faces of the electrolyte on either side of the electrolyte, the second electrode being able to supply mobile ions circulating in the solid electrolyte to the first electrode to form a conductive filament between the first and second electrodes when a voltage is applied between the first and second electrodes;
the solid electrolyte comprising a region made of an oxide of a first metal, designated "first metal oxide" and the region being doped by a second metal, distinct from the first metal and able to form a second metal oxide, the second metal being selected such that the first metal oxide doped by the second metal has a band gap energy less than or equal to the band gap energy of the first metal oxide not doped by the second metal.

"Band gap energy", or "gap", of a material is taken to mean the width of the band gap of the material, that is to say the energy difference between the minimum of the conduction band and the maximum of the valence band. An embodiment of the invention beneficially makes it possible to contribute to the creation of a plurality of oxygen vacancies in the electrolyte, and particularly in the region of the electrolyte made of first metal oxide doped by the second metal. This plurality of oxygen vacancies makes it possible to facilitate the movement of mobile ions, and thus the formation of the conductive filament. One thus contributes to reducing the forming voltage, that is to say the voltage to apply between the soluble electrode and the inert electrode to enable the formation of the conductive filament during the forming step. The quantity of oxygen vacancies in the region made of first metal oxide doped by the second metal is beneficially sufficiently important to reduce the band gap energy of the region, and thus to increase the conductivity of the region. The second metal is beneficially selected such that the band gap energy of the first metal oxide doped by the second metal is less than or equal to the band gap energy of the first metal oxide not doped by the second metal.

Apart from the characteristics that have been evoked in the previous paragraph, the device according to an aspect of the invention may have one or more additional characteristics among the following, considered individually or according to any technically possible combinations thereof:
  The second metal is beneficially selected such that the band gap energy of the second metal oxide is less than or equal to the band gap energy of the first metal oxide.
  The first metal oxide is beneficially gadolinium oxide $Gd_2O_3$ and the second metal is beneficially selected from the following metals:
    hafnium Hf;
    zirconium Zr;
    titanium Ti.
  Alternatively, the band gap energy of the second metal oxide is greater than the band gap energy of the first metal oxide and the atomic concentration of the second metal dopant within the region of the solid electrolyte is beneficially such that the first metal oxide doped by the second metal has a band gap energy less than or equal to the band gap energy of the first metal oxide not doped by the second metal.
  The first metal oxide is beneficially gadolinium oxide $Gd_2O_3$ and the second metal is beneficially aluminum Al.
  The first metal oxide doped by the second metal has a ratio R less than 1, the ratio R being expressed by: R=(M1+M2)/O, with M1 the atomic concentration of first metal, M2 the atomic concentration of second metal and O the atomic concentration of oxygen.
  In the case where the band gap energy of the second metal oxide is less than or equal to the band gap energy of the first metal oxide, the doping is beneficially carried out such that the ratio R=(M1+M2)/O of the first metal oxide doped by the second metal is greater than the ratio R'=M1/O of the first metal oxide not doped by the second metal.
  Alternatively, in the case where the band gap energy of the second metal oxide is greater than the band gap energy of the first metal oxide, the doping is advantageously carried out such that: the ratio R=(M1+M2)/O of the first metal oxide doped by the second metal increases until the band gap energy of the first metal oxide doped by the second metal becomes less than the band gap energy of the first metal oxide not doped by the second metal.
  Alternatively, the first metal oxide could in particular be aluminum oxide $Al_2O_3$, zirconium dioxide $ZrO_2$, titanium dioxide $TiO_2$ or tantalum oxide $Ta_2O_5$. In the particular example where the first metal oxide is aluminum oxide $Al_2O_3$, the second metal could for example be hafnium Hf or titanium Ti.
  The atomic percentage of the second metal within the region of the solid electrolyte is beneficially substantially comprised between 5% and 30%, and in an embodiment substantially comprised between 10% and 20%. The memory cell thus has improved electrical performances. "Atomic percentage of the second metal within the region of the solid electrolyte" is taken to mean the atomic percentage of the second metal in the first metal oxide doped by the second metal, that is to say the percentage of atoms of second metal compared to the sum of the percentages of atoms of first metal, of oxygen and of second metal.

According to a first alternative, the region made of first metal oxide doped by the second metal may be situated in an upper part of the solid electrolyte, in contact with the second electrode made of soluble material.

According to a second alternative, the region made of first metal oxide doped by the second metal may be situated in a lower part of the solid electrolyte, in contact with the first electrode made of inert material.

According to a third alternative, the solid electrolyte beneficially comprises:
  a first sub-layer in contact with the first electrode made of inert material, and
  a second sub-layer in contact with the second electrode made of soluble material;
the region of the solid electrolyte made of first metal oxide doped by the second metal being a central sub-layer comprised between the first and second sub-layers.

According to a fourth alternative, the solid electrolyte is entirely formed by the region made of first metal oxide doped by the second metal.

Embodiments of the invention and their different applications will be better understood on reading the description that follows and by examining the figures that accompany it.

BRIEF DESCRIPTION OF THE FIGURES

The figures are presented for indicative purposes and in no way limit the invention.

DETAILED DESCRIPTION

Unless stated otherwise, a same element appearing in the different figures has a single reference.

In the present description, "oxide based CBRAM memory cell" is taken to mean a CBRAM memory cell comprising an electrolyte based on a metal oxide. One of the difficulties of oxide based CBRAM memories relates to the formation of the filament in the electrolyte. In fact, since metal oxides are dense materials, it is difficult to introduce atoms constituting the filament into an electrolyte based on metal oxide.

Figure 1:
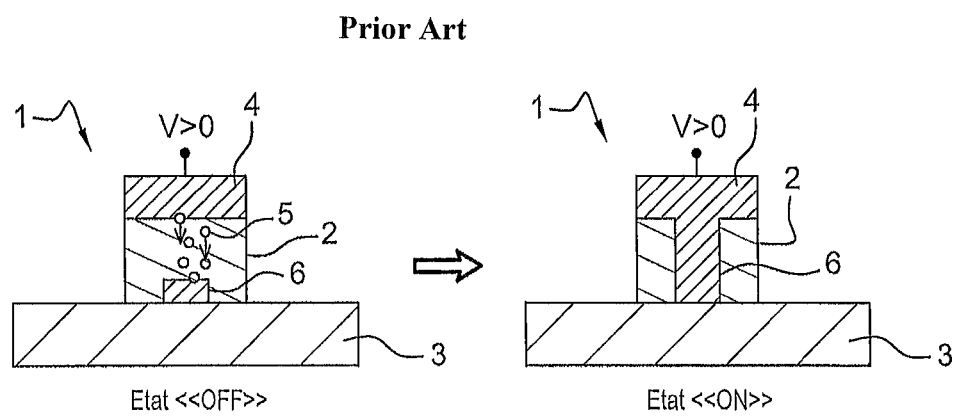
FIG. 1 schematically illustrates the passage from an "OFF" state to an "ON" state for a CBRAM type memory device 1.
Figure 2A:
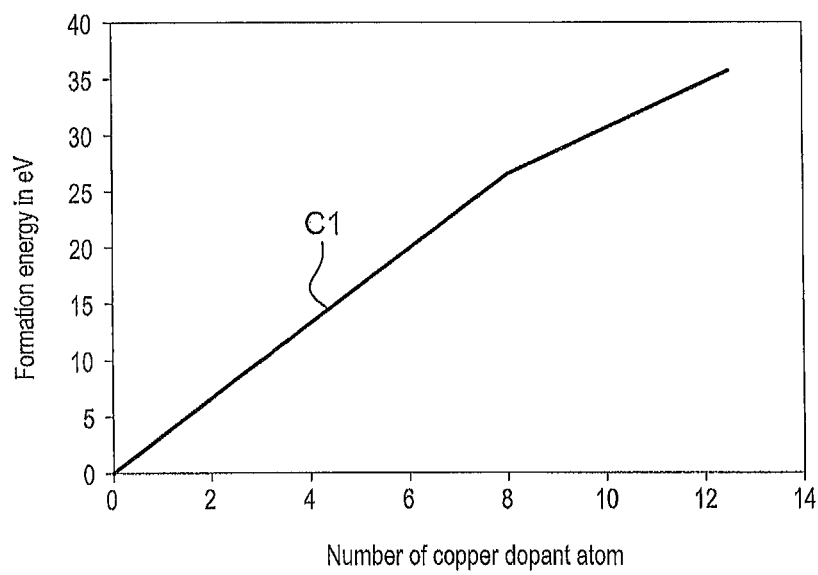
FIGS. 2A and 2B illustrate the results of "ab initio" calculations, carried out for the example of a CBRAM memory cell having an electrolyte based on gadolinium oxide $Gd_2O_3$ and operating by transport of copper in the electrolyte for the formation of the conductive filament.
Figure 2B:
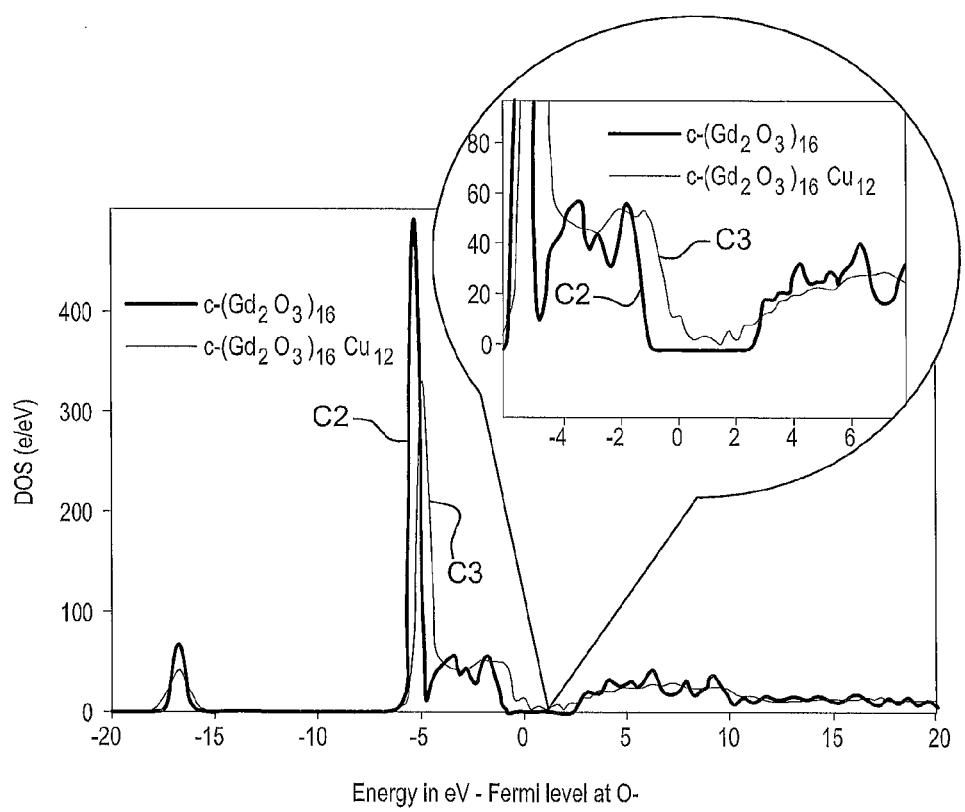

FIGS. 2A and 2B illustrate the results of "ab initio" calculations, carried out for the example of a CBRAM memory cell having an electrolyte based on gadolinium oxide $Gd_2O_3$ and operating by transport of copper in the electrolyte for the formation of the conductive filament.

FIG. 2A thus shows a first curve C1 of the evolution of the energy of formation, measured in eV, of the conductive filament as a function of the number of copper atoms present in the electrolyte.

The first curve C1 indicates a continuous increase in the energy of formation as a function of the number of copper atoms in the electrolyte.

FIG. 2B shows for its part:
  a second curve C2 of the evolution of the state density as a function of the energy in the electrolyte when no atom of copper is introduced into the electrolyte;
  a third curve C3 of the evolution of the state density as a function of the energy in the electrolyte when copper atoms are introduced into the electrolyte.

The state density is measured in number of electronic states per eV. The energy is measured in eV. More exactly, on the abscissa of FIG. 2B is represented the energy less the Fermi energy, measured in eV. The Fermi level is thus located at the zero abscissa. The second curve C2 shows that, when no atom of copper is included in the electrolyte, the Fermi level is located in the band gap, or "gap", of the electrolyte material, which does not comprise any electronic state: the electrolyte is insulating. The third curve C3 shows that, when copper atoms are included in the electrolyte, electronic states appear in what was previously the band gap of the electrolyte material. This reflects the fact that the electrolyte becomes conductive, that is to say that the filament forms.

The table below groups together the results of "ab initio" simulations carried out for cubic gadolinium oxide $Gd_2O_3$. The energy required to insert an atom of copper into the electrolyte, or enthalpy of formation $\Delta H_f$, is calculated according to the formula:

$$\Delta H_f = U(Gd_2O_3:Cu^{+q}) - U(Gd_2O_3) + U(O_{(g)}) - U(Cu_{(s)}) + q \times \mu_e$$

U(species) designates the internal energy of a species; $\mu_e$ designates the chemical potential of an electron and q designates the charge of an electron.

| | Enthalpy of formation $\Delta H_f$ (eV) | Stress (GPa) |
|---|---|---|
| Interstitial Cu atom | 3.77 | 1.23 |
| Cu atom substituted for an O atom | 8.84 | −1.41 |
| Cu atom substituted for a Gd atom | 10.50 | −1.40 |
| Interstitial Cu atom and vacancy of an O atom | 8.84 | −1.41 |
| Vacancy of an O atom | 7.41 | 0.15 |
| Interstitial Cu atom in a vacancy of an O atom initially present | 1.43 | 1.38 |
| Interstitial O atom | 1.10 | $-10^{-3}$ |

These simulations show that the insertion of an interstitial copper atom into gadolinium oxide $Gd_2O_3$ is a more favourable configuration, that is to say requiring less energy and having a lower enthalpy of formation $\Delta H_f$, than the substitution of an oxygen or gadolinium atom by a copper atom. The enthalpy of formation for the insertion of an interstitial copper atom is in fact equal to 3.77 eV, whereas the enthalpy of formation for the substitution of a copper atom for a gadolinium atom (respectively, for an oxygen atom) is equal to 10.50 eV (respectively, 8.84 eV).

When oxygen vacancies are present in the $Gd_2O_3$, the energy cost to introduce copper into the $Gd_2O_3$ is reduced from 3.77 eV to 1.43 eV. These ab initio calculations thus make it possible to conclude that the presence of oxygen vacancies favours the introduction of copper into gadolinium oxide, thus the formation of the filament within the electrolyte.

Figures 3, 4:
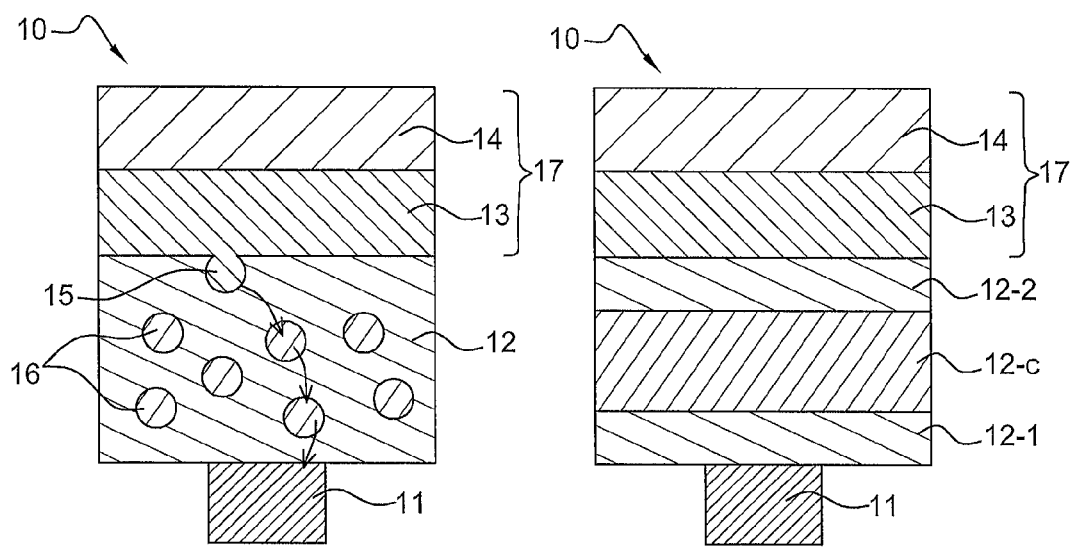
FIG. 3 schematically shows the structure of an oxide based CBRAM memory cell according to an embodiment of the invention.
FIG. 4 schematically shows the structure of an oxide based CBRAM memory cell according to a variant of the embodiment of the invention of FIG. 3.

FIG. 3 schematically shows the structure of an oxide based CBRAM memory cell 10 according to a first embodiment of the invention. The memory cell 10 comprises:
- a first electrode 11, also called cathode or inert electrode hereafter;
- a solid electrolyte 12. The solid electrolyte 12 comprises a region made of oxide of a first metal, designated "first metal oxide", the region being doped by a second metal, distinct from the first metal and able to form a second metal oxide. The first metal oxide doped by the second metal has a band gap energy less than or equal to the band gap energy of the first metal oxide not doped by the second metal. The reduction in the band gap energy of the doped first metal oxide compared to the non-doped first metal oxide reflects the increase in the quantity of oxygen vacancies 16 in the doped first metal oxide of the solid electrolyte 12;
- a second electrode 17, also called anode or soluble electrode hereafter, and comprising a source of ions layer 13 and a metal line 14;

When a voltage is applied between the inert electrode 11 and the metal line 14 of the soluble electrode 17, the source of ions layer 13 supplies mobile ions 15 which circulate in the solid electrolyte 12 to the inert electrode 11 to form a conductive filament between the inert electrode 11 and the soluble electrode 17. The oxygen vacancies 16 facilitate the interstitial inclusion of mobile ions 15 in the solid electrolyte 12.

According to the first embodiment illustrated in FIG. 3, the inert electrode 11 is a pad, for example made from an inert interconnection metal, such as tungsten W, titanium nitride TiN or tantalum nitride TaN.

According to the first embodiment illustrated in FIG. 3, the solid electrolyte 12 is made of gadolinium oxide $Gd_2O_3$ and the second metal dopant is hafnium Hf. Alternatively, the second metal dopant could in particular be zirconium Zr, aluminum Al or titanium Ti.

According to the first embodiment illustrated in FIG. 3, the source of ions layer 13 of the soluble electrode 17 is made from an alloy of copper Cu and of an element of the chalcogen family such as Te. The source of ions layer 13 of the soluble electrode 17 may thus be made from CuTe. More generally, the source of ions layer 13 may be made from copper Cu and alloys thereof, silver Ag and alloys thereof, zinc Zn and alloys thereof, an alloy of copper and/or zinc and/or silver, such as: AgCu, AgZn, CuZn, AgCuZn, and alloys thereof.

Several variants are possible for the first embodiment according to which the region of the solid electrolyte 12 is doped with hafnium Hf, among which:
- a first variant according to which the whole of the solid electrolyte 12 is doped, the atomic percentage of hafnium Hf in the solid electrolyte 12 being substantially equal to 15%;
- a second variant, more particularly illustrated in FIG. 4, according to which the doped region of the solid electrolyte 12 is a central sub-layer 12-c of the solid electrolyte 12, the atomic percentage of hafnium Hf in the central sub-layer 12-c being substantially equal to 20%. The central sub-layer 12-c of the solid electrolyte 12 is comprised between first and second sub-layers 12-1 and 12-2 of the solid electrolyte 12, the first sub-layer 12-1 being in contact with the inert electrode 11, and the second sub-layer 12-2 being in contact with the source of ions layer 13.

According to a second embodiment of the invention, the solid electrolyte 12 is made of gadolinium oxide $Gd_2O_3$ and the second metal dopant is titanium Ti, the atomic percentage of titanium Ti in the solid electrolyte 12 being substantially equal to 18%.

According to the first embodiment, the band gap energy of the solid electrolyte made of $Gd_2O_3$ doped with hafnium is typically of the order of 4.4 eV +/−1 eV, as a function of in particular the deposition method, the quality of the material, etc.

According to the second embodiment, the band gap energy of the solid electrolyte made of $Gd_2O_3$ doped with titanium is typically of the order of 4.1 eV +/−1 eV, as a function of in particular the deposition method, the quality of the material, etc.

In comparison, a band gap energy of the order of 6 eV has been measured for a solid electrolyte made of non-doped gadolinium oxide $Gd_2O_3$.

More generally, the region made of first metal oxide doped by the second metal forming the whole of the solid electrolyte 12 or uniquely a part of the solid electrolyte 12, the region made of first metal oxide doped by the second metal has an atomic percentage of second metal comprised between 5% and 30%, and in an embodiment comprised between 10% and 20%.

Figure 5:
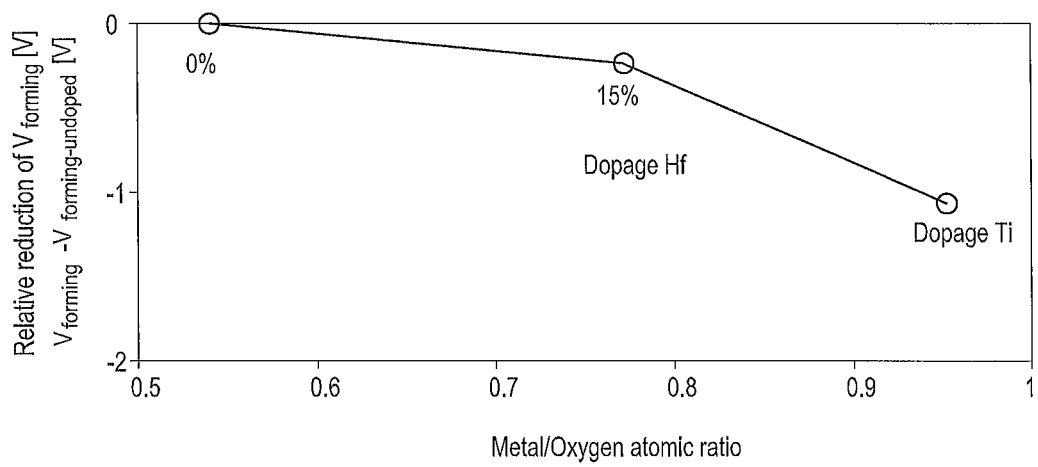
FIG. 5 shows the forming voltages required to obtain a forming yield of 50% for different types of CBRAM memory cells according to an embodiment of the invention, compared to a CBRAM memory cell according to the prior art.

FIG. 5 described hereafter groups together several experimental results making it possible to show quantitatively the improvement in electrical performances of CBRAM memory cells according to an embodiment of the invention, compared to a conventional CBRAM memory cell according to the prior art.

FIG. 5 thus shows the forming voltages required to obtain a forming yield corresponding to the median value of the voltage of formation of the filament, for an experiment concerning a hundred or so CBRAM memory cells. As a reminder, "forming" a CBRAM memory cell is taken to mean the step consisting in writing for the first time the CBRAM memory cell, that is to say forming for the first time the filament in the electrolyte of the CBRAM memory cell. A forming yield of 50% thus signifies that the filaments of 50% of the memory cells tested have actually been formed for the first time. The experiments, the results of which are grouped together in FIG. 5, have been carried out on samples of which the size is of the order of one hundred CBRAM memory cells.

The forming voltage for a CBRAM memory cell according to the first variant of the first embodiment, having a solid electrolyte made of $Gd_2O_3$ doped with an atomic percentage of hafnium Hf of the order of 15%, is reduced by around 350 mV compared to the reference case.

The forming voltage for a CBRAM memory cell according to the second embodiment of the invention, that is to say which has a solid electrolyte made of $Gd_2O_3$ doped with an atomic percentage of titanium Ti of the order of 18%, is reduced by around 1.1 V compared to the reference case.

Several variants of embodiment of a CBRAM memory cell according to the invention have been described until now. Several examples of possible dopants and several possible examples of atomic percentages of the dopants within the doped region of the solid electrolyte 12 are thus given. The doped region of the solid electrolyte 12 may moreover be a part, or the whole of the solid electrolyte 12.

An example of experimental rule making it possible to contribute to determining additional variants of CBRAM memory cells according to an embodiment of the invention will now be described. It will be recalled here that the doped region of the solid electrolyte 12 is made of the first metal oxide doped by the second metal. The first metal oxide has a first metal/oxide ratio R1, which is expressed thus: R1=M1/O, with M1 the atomic concentration of first metal and O the atomic concentration of oxygen. The first metal oxide doped by the second metal has for its part a second metal/oxide ratio R2, which is expressed thus: R2=(M1+M2)/O, with M1 the atomic concentration of first metal, M2 the atomic concentration of second metal and O the atomic concentration of oxygen.

In order to obtain a CBRAM memory cell according to an embodiment of the invention, it means that the second metal/oxide ratio R2 respects the following first condition: R2>R1. Beneficially, the second metal/oxide ratio R2 also respects the following second condition: R2<1.

The first condition makes it possible, by moving away from the first metal/oxide ratio R1 corresponding to the stoichiometric first metal oxide, to facilitate the inclusion of mobile ions in the doped region of the solid electrolyte oxide 12. The second condition Beneficially makes it possible to contribute so that the first metal oxide doped by the second metal continues to have a sufficient electrical insulation, that is to say typically a resistance greater than 10 kΩ.

The doped region of the solid electrolyte 12 may for example be made by carrying out a co-sputtering of a target of first metal oxide and a target of second metal. It is particularly possible to measure the atomic percentage of the second metal dopant within the doped region of the solid electrolyte 12 by a Rutherford Backscattering Spectroscopy (RBS) technique.

The device according to an embodiment of the invention is naturally not limited to the variants of embodiment that have been described above by way of indication and in no way limiting with reference to FIGS. 2A to 5. Thus, even though the invention has been described in an illustrative manner for a solid oxide electrolyte based on $Gd_2O_3$, several other cases may be envisaged. By way of example the following configurations may be cited, considered individually or according to all technically possible combinations thereof:

- the solid oxide electrolyte comprises at least one double layer of type $Gd_2O_3/Al_2O_3$, $Gd_2O_3/GeO$, $Gd_2O_3/La_2O_3$, $Gd_2O_3/Li_2O$, $Gd_2O_3/B_2O_3$, $Gd_2O_3/WO_2$, $Gd_2O_3/VO_2$, $Gd_2O_3/V_2O_5$, $Gd_2O_3/MgO$ or $Gd_2O_3/MgAl_2O_4$;
- the solid oxide electrolyte comprises at least one triple layer of type $Gd_2O_3/Al_2O_3/Gd_2O_3$, $Gd_2O_3/GeO/Gd_2O_3$, $Gd_2O_3/La_2O_3/Gd_2O_3$, $Gd_2O_3/Li_2O/Gd_2O_3$, $Gd_2O_3/B_2O_3/Gd_2O_3$, $Gd_2O_3/WO_2/Gd_2O_3$, $Gd_2O_3/VO_2/Gd_2O_3$, $Gd_2O_3/V_2O_5/Gd_2O_3$, $Gd_2O_3/MgO/Gd_2O_3$, $Gd_2O_3/MgAl_2O_4/Gd_2O_3$;
- the first metal oxide is aluminum oxide $Al_2O_3$, zirconium dioxide $ZrO_2$, titanium dioxide $TiO_2$ or tantalum oxide $Ta_2O_5$.

The invention claimed is:

1. A resistive random access memory device comprising:
a first electrode made of inert material;
a second electrode made of soluble material;
a solid electrolyte, the first and second electrodes being respectively in contact with one of the faces of the electrolyte on either side of the electrolyte, the second electrode being configured to supply mobile ions circulating in the solid electrolyte to the first electrode to form a conductive filament between the first and second electrodes when a voltage is applied between the first and second electrodes;
wherein the solid electrolyte comprises a region of a first-metal oxide doped by a second metal, the second metal distinct from the first-metal and forming a second-metal oxide, said second metal selected such that the first-metal oxide doped by the second metal has a band gap energy less than or equal to a band gap energy of an undoped first-metal oxide material.

2. The device according to claim 1, wherein the second metal is selected such that a band gap energy of the second-metal oxide is less than or equal to the band gap energy of the first-metal oxide.

3. The device according to claim 2, wherein the first-metal oxide is gadolinium oxide $Gd_2O_3$ and wherein the second metal is selected from the following metals:
hafnium Hf;
zirconium Zr;
titanium Ti.

4. The device according to claim 1, wherein the band gap energy of the second-metal oxide is greater than the band gap energy of the first-metal oxide and wherein an atomic concentration of the second metal dopant within the region of the solid electrolyte is such that the first-metal oxide doped by the second metal has a band gap energy less than or equal to the band gap energy of the first-metal oxide not doped by the second metal.

5. The device according to claim 4, wherein the first-metal oxide is gadolinium oxide $Gd_2O_3$ and wherein the second metal is aluminum Al.

6. The device according to claim 1, wherein the first-metal oxide is aluminum oxide $Al_2O_3$, zirconium dioxide $ZrO_2$, titanium dioxide $TiO_2$ or tantalum oxide $Ta_2O_5$.

7. The device according to claim 1, wherein the first-metal oxide doped by the second metal has a ratio R less than 1, the ratio R being expressed by: R=(M1+M2)/O, with M1 the atomic concentration of first metal, M2 the atomic concentration of second metal and O the atomic concentration of oxygen.

8. The device according to claim 1, wherein an atomic percentage of the second metal within the region of the solid electrolyte is substantially comprised between 5% and 30%.

9. The device according to claim 8, wherein the atomic percentage is comprised between 10% and 20%.

10. The device according to claim 1, wherein the solid electrolyte further comprises:
a first sub-layer in contact with the first electrode made of inert material, and
a second sub-layer in contact with the second electrode made of soluble material;
and wherein the region of the first-metal oxide doped by the second metal is a central sub-layer located between the first sub-layer and the second sub-layer.

11. The device according to claim 1, wherein the solid electrolyte is entirely formed by the region made of first-metal oxide doped by the second metal.

* * * * *